United States Patent [19]
Wuertz et al.

[11] Patent Number: 5,270,983
[45] Date of Patent: Dec. 14, 1993

[54] SINGLE ELEMENT SECURITY FUSIBLE LINK

[75] Inventors: William J. Wuertz, Fort Collins; Steven K. Stefek, Lovelamp; William W. McKinley, Fort Collins, all of Colo.

[73] Assignee: NCR Corporation, Dayton, Ohio

[21] Appl. No.: 582,705

[22] Filed: Sep. 13, 1990

[51] Int. Cl.$^5$ .............................................. G11C 7/00
[52] U.S. Cl. ................................... 365/225.7; 365/52; 365/63; 365/189.01; 307/202.1; 307/296.5; 307/303.1; 307/465; 307/565
[58] Field of Search .......... 365/225.7, 52, 63, 189.01; 307/202.1, 296.5, 303.1, 465, 565

[56] References Cited

U.S. PATENT DOCUMENTS

| | | | |
|---|---|---|---|
| 4,157,480 | 6/1979 | Edwards | 365/225.7 |
| 4,417,154 | 11/1983 | Kuo | 307/202.1 |
| 4,446,534 | 5/1984 | Smith | 365/96 |
| 4,480,199 | 10/1984 | Varshney et al. | 307/303 |
| 4,903,111 | 2/1990 | Takemae et al. | 357/51 |
| 4,933,898 | 6/1990 | Gilberg et al. | 307/202.1 |
| 4,935,645 | 6/1990 | Lee | 365/225.7 |
| 5,065,057 | 11/1991 | Kawasaki | 307/296.5 |

FOREIGN PATENT DOCUMENTS

| | | | |
|---|---|---|---|
| 2-189799 | 7/1990 | Japan | 365/225.7 |
| 2-192093 | 7/1990 | Japan | 365/225.7 |

Primary Examiner—Joseph E. Clawson, Jr.
Attorney, Agent, or Firm—Douglas S. Foote; Paul J. Maginot

[57] ABSTRACT

An I/O circuit including first and second I/O pads, a fuse connected between the first pad and a RAM write enable line, and a diode-connected transistor connected between the RAM write enable line and second pad. Data is written to the RAM by applying a voltage potential to the pads after which the fuse is blown by increasing the potential difference. Other forms of the invention include a resistor connected between the RAM write enable line and ground, and I/O lines connected between the pads, respectively, and a logic circuit.

15 Claims, 1 Drawing Sheet

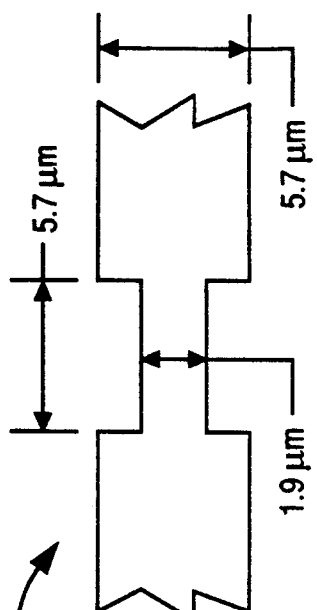
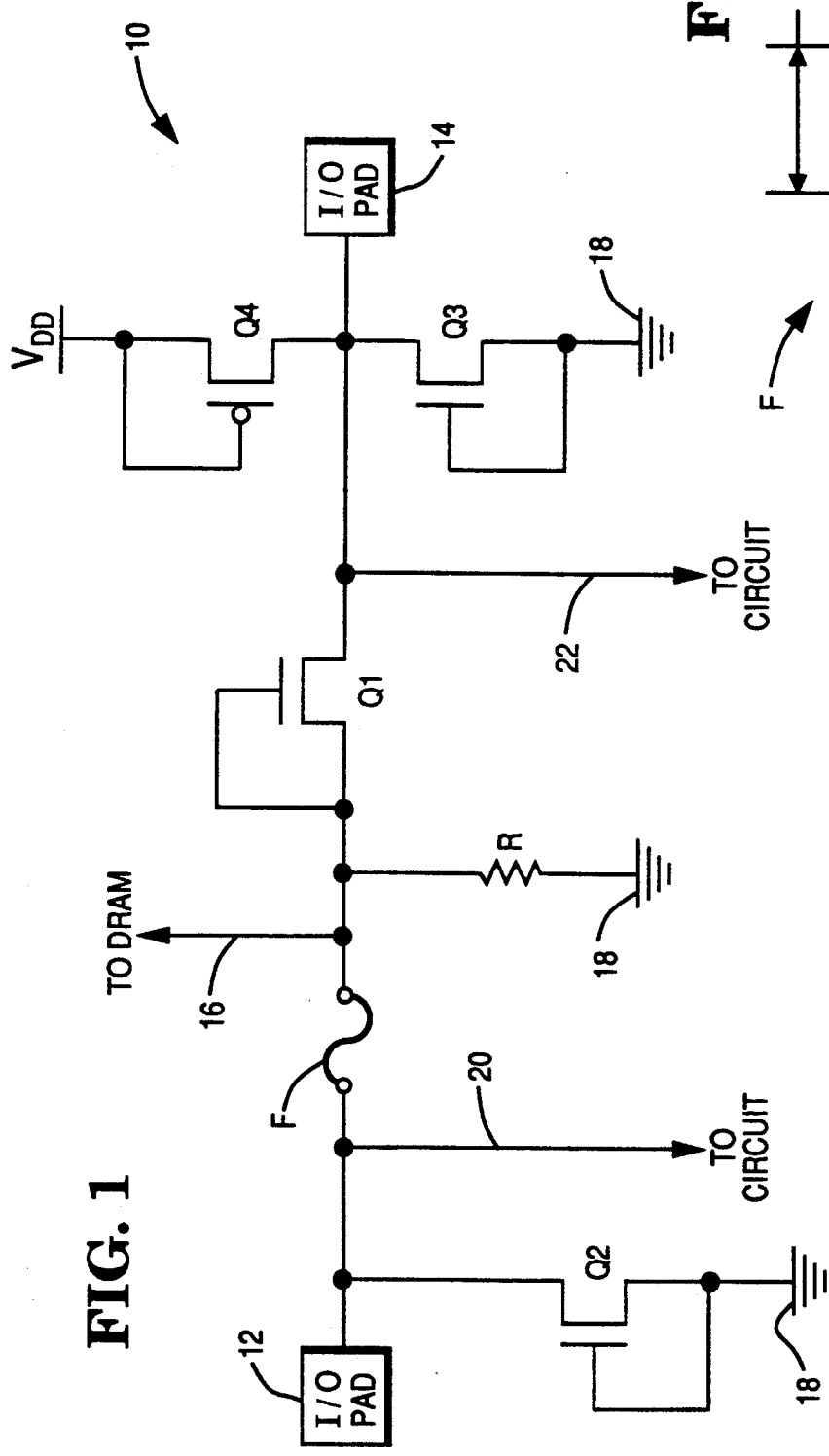

SINGLE ELEMENT SECURITY FUSIBLE LINK

The present invention relates generally to integrated circuits (ICs). More particularly, it relates to input/output (I/O) circuits for ICs and to fusible links which provide security for ICs.

BACKGROUND OF THE INVENTION

Integrated circuit chips are used in a multitude of different applications, many requiring some form of security for data stored on the chip. Typically, a means is provided to prevent data stored on the chip from being read by an external agent. Under certain circumstances it may also be desirable to prevent data from being written onto the chip. For example, data stored on the chip may be used as a key to decipher or decode a public signal such a scrambled satellite video signal. Even if the stored data can not be read, if the stored data can be overwritten by an external agent, the code may be broken by a systematic overwriting of the data and iterative comparisons to the scrambled signal.

A read only memory (ROM) is a typical memory device which can not be overwritten. However, ROMs are programmed during manufacture which can create security problems for the end user who may desire to keep its code confidential. A programmable read only memory (PROM) may be programmed by the end user, thereby avoiding confidentiality problems. However, a PROM is less secure since it maintains its contents when voltage is removed, allowing the contents to be microprobed. The code in a PROM can also be read with an electron beam. Furthermore, a PROM is more expensive to produce than a RAM.

To the extent that previous security measures include the use of I/O pads on the chip, such pads are most likely dedicated exclusively to the security function. As the need to provide additional signal lines to a chip increases, the use of I/O pads for limited or one-time security functions is undesirable. This is particularly true if the pads are needed only to initially secure the data on the chip and are not required for normal operations.

OBJECTS OF THE INVENTION

It is therefore an object of the present invention to provide a new and improved I/O circuit.

It is another object of the present invention to provide a circuit for securing data on an integrated circuit.

It is a further object of the present invention to provide a circuit for preventing stored data on a chip from being overwritten.

It is yet another object of the present invention to provide single element security fusible link for an I/O circuit.

It is yet a further object of the present invention to provide an I/O circuit with multifunction I/O pads.

It is still another object of the present invention to provide an I/O circuit having a fusible link and increased resistance to voltage spikes on the I/O pads.

SUMMARY OF THE INVENTION

The present invention is an I/O circuit comprising first and second I/O pads, a fuse connected between the first pad and a signal line, and a diode connected between the signal line and second pad. In a preferred embodiment, the diode is a diode connected transistor. Other forms of the invention include a resistor connected between the signal line and ground, and I/O lines connected between the pads, respectively and a logic circuit.

BRIEF DESCRIPTION OF THE DRAWINGS

FIG. 1 is a diagram of an I/O circuit according to one form of the present invention.

FIG. 2 shows the physical layout of the fuse F in FIG. 1.

DESCRIPTION OF A PREFERRED EMBODIMENT

FIG. 1 shows an I/O circuit 10 which may be embodied in an integrated circuit logic chip. Circuit 10 includes I/O pads 12 and 14 which are typically located on the periphery of a chip together with a plurality of other I/O pads for transmitting signals to and receiving signals from the chip. Circuit 10 also includes a fuse F and a diode connected transistor Q1. Fuse F and transistor Q1 are series connected between I/O pad 12 and I/O pad 14 with fuse F connected between a signal line 16 and pad 12, and transistor Q1 connected between signal line 16 and pad 14.

In a preferred embodiment, fuse F is made of Al, 1% Si, and 0.05% Cu, and has a range of cross-sectional areas from 1.10 to 1.52 (micrometers)$^2$. Current pulse requirements is about 460 mA for the minimum cross-sectional area, and about 540 mA for the maximum cross-sectional area. FIG. 2 shows a more detail view of fuse F with exemplary dimensions provided. For additional security, fuse F when implemented in an integrated circuit may be covered with a dielectric which is overlayed with another metalization layer. This arrangement should deter access by microprobing of the circuit.

Referring again to FIG. 1, diode connected transistor Q1 is arranged so that the equivalent diode anode is connected to signal line 16. For transistor Q1, this means that its control electrode is connected to signal line 16. Preferably, transistor Q1 is an N-type MOSFET with gate and drain connected to signal line 16. I/O circuit 10 also includes a resistor R connected between signal line 16 and a reference voltage terminal 18. For a CMOS implementation of the present invention, reference voltage terminal 18 is ground.

Another feature of I/O circuit 10 is I/O lines 20 and 22. I/O line 20 is connected from fuse pad 12 to other elements of the logic circuit sharing the chip with circuit 10. Similarly, I/O line 22 is connected from fuse pad 14 to other elements of the logic circuit.

A further feature of I/O circuit 10 is diode connected transistors Q2, Q3 and Q4. Diode connected transistor Q2 is connected from I/O pad 12 to reference voltage terminal 18. Preferably, transistor Q2 is an N channel MOSFET having its control electrode connected to terminal 18. Diode connected transistor Q3 is connected from pad 14 to reference voltage terminal 18, and diode connected transistor Q4 is connected from pad 14 to reference voltage terminal $V_{DD}$. Preferably, transistor Q3 is an N channel MOSFET having its control electrode connected to terminal 18, and transistor Q4 is a P channel MOSFET having its control electrode connected to terminal $V_{DD}$. For a CMOS implementation of the present invention, $V_{DD}$ is about 5 volts and, as noted above, reference voltage terminal 18 is ground. In a preferred embodiment, the width/length of transistor Q1 is 4310 microns/1.5 microns, transistor Q2 is 2200 microns/1.5 microns, transistors Q3 and Q4 are each 1100 microns/1.5 microns, and the resistance of R is 7K ohms.

The various forms of the present invention will have many applications, as will be evident to those skilled in the art. However, an important application of the present invention is to prevent write access to a RAM after its initial loading with data. In such an application, signal line 16 is the write enable line of the RAM. The following discussion will assume signal line 16 is a RAM write enable line.

In operation, write enable line 16 is pulled active high by applying a voltage potential of about 5.0 volts to I/O pad 12. Data can then be written to the RAM. After data is stored in the RAM, fuse F is blown by applying about 7.0 volts to I/O pad 12 while grounding I/O pad 14. Thereafter, write enable line 16 can not be accessed through I/O pad 12 because of the open circuit. Nor can line 16 be pulled high by a voltage applied to I/O pad 14, because transistor Q1 is always off by virtue of its gate being grounded through resistor R. Thus, the present invention provides a simple yet effective design for preventing write accesses to the RAM.

After fuse F is blown, I/O pads 12 and 14 can operate as normal I/O pads with access to logic circuitry through I/O lines 20 and 22. Accordingly, I/O pads 12 and 14 are multifunctional, thereby reducing the required number of pads on the integrated circuit chip.

Voltage transient protection is provided by transistors Q2, Q3 and Q4. Transistors Q2, Q3 and Q4 either forward bias or breakdown in the presence of voltage spikes. In this manner, they prevent damage to the logic circuit when subjected to large voltage, low amperage spikes such as caused by electrostatic discharge. For example, in the presence of a voltage spike greater than $V_{DD}+0.6$ volts, diode connected transistor Q4 is activated thereby shunting harmful current and voltage build-up to the $V_{DD}$ supply.

It will be clear to those skilled in the art that the present invention is not limited to the specific embodiment disclosed and illustrated herein. It will be understood that the dimensions shown in FIG. 2 are exemplary and are not intended to be limiting. Numerous modifications, variations, and full and partial equivalents can be undertaken without departing from the invention as limited only by the spirit and scope of the appended claims.

What is desired to be secured by Letters Patent of the United States is as follows.

What is claimed is:

1. In an integrated circuit, an I/O circuit comprising: first and second I/O pads;
a fuse connected between said first pad and a signal line; and
a diode connected between said signal line and second pad;
wherein said fuse and diode are series connected between said first and second I/O pads and the anode of said diode is connected to said fuse, and
wherein said signal line is a write enable line connected to a RAM.

2. In an integrated circuit, an I/O circuit comprising: first and second I/O pads;
a fuse connected between said first pad and a signal line;
a diode connected between said signal line and second pad; and
a resistor connected between said signal line and a reference voltage terminal,
wherein said fuse and diode are series connected between said first and second I/O pads and the anode of said diode is connected to said fuse.

3. The circuit of claim 2 wherein said reference voltage terminal is ground.

4. The circuit of claim 3 further comprising:
an I/O line connected from said first pad to a logic circuit.

5. The circuit of claim 4 further comprising:
an I/O line connected from said second pad to a logic circuit.

6. In an integrated circuit, an I/O circuit comprising: first and second I/O pads;
a fuse connected between said first pad and a signal line;
a first diode connected between said signal line and second pad; and
a second diode connected from said first pad to a reference voltage terminal,
wherein said fuse and first diode are series connected between said first and second I/O pads and the anode of said first diode is connected to said fuse.

7. The circuit of claim 6 wherein said second diode is an N channel transistor having its control electrode connected to said reference voltage terminal, and wherein said reference voltage terminal is ground.

8. In an integrated circuit, an I/O circuit comprising: first and second I/O pads;
a fuse connected between said first pad and a signal line;
a first diode connected between said signal line and second pad;
a second diode connected from said second pad to a first reference voltage terminal, and
a third diode connected from said second pad to a second reference voltage terminal,
wherein said fuse and first diode are series connected between said first and second I/O pads and the anode of said first diode is connected to said fuse.

9. The circuit of claim 8 wherein said second diode is an N channel transistor having its control electrode connected to said first reference voltage terminal, and wherein said third diode is a P channel transistor having its control electrode connected to said second reference voltage terminal.

10. The circuit of claim 9 wherein said first reference voltage terminal is ground and said second reference voltage terminal is about 5 volts.

11. An I/O circuit comprising:
first and second I/O pads;
a fuse connected between said first pad and a signal line;
a first diode connected between said signal line and second pad;
a resistor connected between said signal line and a first reference voltage terminal;
a first I/O line connected from said first fuse pad to a logic circuit;
a second I/O line connected from said second fuse pad to said logic circuit;
a second diode connected from said first pad to said first reference voltage terminal;
a third diode connected from said second pad to said first reference voltage terminal; and
a fourth diode connected from said second pad to a second reference voltage terminal.

12. The circuit of claim 11 wherein said first diode is an N channel transistor having its control electrode connected to said signal line.

13. The circuit of claim 12 wherein said second diode is an N channel transistor having its control electrode connected to said first reference voltage terminal, wherein said third diode is an N channel transistor having its control electrode connected to said first reference voltage terminal, wherein said fourth diode is a P channel transistor having its control electrode connected to said second reference voltage terminal, and wherein said first reference voltage terminal is ground and said second reference voltage terminal is about 5 volts.

14. The circuit of claim 13 wherein each of said transistors is MOSFET.

15. The circuit of claim 14 wherein said signal line is a write enable line connected to a RAM.